United States Patent
Bae et al.

(10) Patent No.: US 11,005,513 B2
(45) Date of Patent: May 11, 2021

(54) RECEIVER CIRCUIT AND RECEIVING SYSTEM

(71) Applicant: SAMSUNG ELECTRONICS CO., LTD., Suwon-si (KR)

(72) Inventors: Jeong Yeol Bae, Yongin-si (KR); Duk Soo Kim, Seoul (KR); Jae Seung Lee, Hwaseong-si (KR); Joong Ho Lee, Suwon-si (KR); Ji Young Lee, Hwaseong-si (KR); Pil Sung Jang, Uijeongbu-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/868,855

(22) Filed: May 7, 2020

(65) Prior Publication Data

US 2021/0075458 A1 Mar. 11, 2021

(30) Foreign Application Priority Data

Sep. 11, 2019 (KR) .................. 10-2019-0112788

(51) Int. Cl.
| | |
|---|---|
| *H04B 3/00* | (2006.01) |
| *H04B 1/26* | (2006.01) |
| *H04B 1/16* | (2006.01) |
| *H04B 1/30* | (2006.01) |
| *H03D 7/14* | (2006.01) |

(52) U.S. Cl.
CPC ............ *H04B 1/26* (2013.01); *H03D 7/1466* (2013.01); *H04B 1/1676* (2013.01); *H04B 1/30* (2013.01)

(58) Field of Classification Search
CPC .......... H04B 1/26; H04B 1/1676; H04B 1/30; H03D 7/1466
USPC .................................................. 375/258, 316
See application file for complete search history.

(56) References Cited

U.S. PATENT DOCUMENTS

| | | | |
|---|---|---|---|
| 7,711,327 B2 | 5/2010 | Sowlati et al. | |
| 8,270,499 B2 | 9/2012 | Chang et al. | |
| 8,489,035 B2 | 7/2013 | Chiang et al. | |
| 8,831,551 B2 | 9/2014 | Lu et al. | |
| 8,965,322 B2 | 2/2015 | Mu | |
| 9,166,852 B2 | 10/2015 | Davierwalla et al. | |
| 9,356,711 B2 | 5/2016 | Kahrizi et al. | |
| 9,543,995 B1 | 1/2017 | Fabiano et al. | |
| 2008/0139149 A1* | 6/2008 | Mu ........................ | H03D 7/165 455/200.1 |
| 2009/0088122 A1* | 4/2009 | Xu ........................ | H03D 7/165 455/333 |
| 2010/0201457 A1* | 8/2010 | Lee ........................ | H03H 11/32 333/117 |

(Continued)

*Primary Examiner* — Don N Vo
(74) *Attorney, Agent, or Firm* — Sughrue Mion, PLLC

(57) ABSTRACT

A receiver circuit is provided. The receiver circuit includes an antenna configured to receive a radio frequency (RF) signal; a filter configured to filter the RF signal received by the antenna; and a passive mixer circuit configured to adjust a center frequency of the filtered RF signal to a predetermined frequency. The passive mixer circuit includes: a transformer which includes a first coil and a second coil that is separate from the first coil; a first passive mixer which is directly connected to a first end of the second coil; and a second passive mixer which is directly connected to a second end of the second coil and is separate from the first passive mixer.

20 Claims, 10 Drawing Sheets

(56) References Cited

U.S. PATENT DOCUMENTS

| | | | |
|---|---|---|---|
| 2010/0279641 A1* | 11/2010 | Lu | H03F 3/45475 |
| | | | 455/232.1 |
| 2014/0162580 A1* | 6/2014 | Leung | H04B 1/1638 |
| | | | 455/226.1 |
| 2018/0159516 A1* | 6/2018 | Ye | H03H 11/30 |

* cited by examiner

RECEIVER CIRCUIT AND RECEIVING SYSTEM

This application claims priority from Korean Patent Application No. 10-2019-0112788, filed on Sep. 11, 2019 in the Korean Intellectual Property Office, the disclosure of which is incorporated herein by reference in its entirety.

BACKGROUND

1. Field

Methods and apparatuses consistent with example embodiments relate to a receiver circuit and a receiving system including the same.

2. Related Art

Signal paths of a transmitter and a receiver in a frequency division duplex (FDD) system operate simultaneously. Although a duplexer operates to distinguish between a transmission signal and a reception signal, it is not able to completely distinguish between the transmission signal and reception signal, causing the transmission signal to exist in a reception signal region.

Thus, the transmission signal can be a significant source of interference in a reception frequency domain. The transmission signal itself causes intermodulation. In particular, when the transmission signal passes through a down-conversion mixer as a differential signal, intermodulation occurs due to a mismatch between differential signals, and the result can be observed in a baseband.

SUMMARY

One or more example embodiments provide a receiver which reduces intermodulation in a mixer.

One or more example embodiments provide a receiving system which reduces intermodulation in a mixer.

Example embodiments are not restricted to the one set forth herein. The above and other aspects of the present disclosure will become more apparent to one of ordinary skill in the art to which the present disclosure pertains by referencing the detailed description of the present disclosure given below.

According to an aspect of an example embodiment, there is provided a receiver circuit that includes an antenna configured to receive a radio frequency (RF) signal; a filter configured to filter the RF signal received by the antenna; and a passive mixer circuit configured to adjust a center frequency of the filtered RF signal to a predetermined frequency. The passive mixer circuit includes: a transformer which includes a first coil and a second coil that is separate from the first coil; a first passive mixer which is directly connected to a first end of the second coil; and a second passive mixer which is directly connected to a second end of the second coil and is separate from the first passive mixer.

According to an aspect of an example embodiment, there is provided a receiver circuit that includes an antenna configured to receive an RF signal; a filter configured to filter the RF signal received by the antenna; and a passive mixer circuit configured to adjust a center frequency of the filtered RF signal to a predetermined frequency. The passive mixer circuit includes: a transformer which includes a first coil and a second coil that is separate the first coil; a first passive mixer configured to receive the RF signal from the second coil; a second passive mixer configured to receive the RF signal from the second coil; and a first capacitor which has a first end connected to the second coil and a second end grounded.

According to an aspect of an example embodiment, there is provided a receiving system that includes an antenna configured to receive an RF signal; a filter configured to filter the RF signal; a passive mixer circuit configured to adjust a center frequency of the filtered RF signal to a predetermined frequency; an analog baseband configured to process an output signal of the passive mixer circuit; and a demodulator configured to demodulate an analog baseband output signal of the analog baseband. The passive mixer circuit includes: a transformer which includes a first coil and a second coil, the filter being connected to the first coil; a first passive mixer which is directly connected to a first end of the second coil and is configured to output the output signal; a second passive mixer which is directly connected to a second end of the second coil and is configured to output the output signal; and a first capacitor which has a first end connected between the first end of the second coil and the second end of the second coil, and a second end grounded.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Hereinafter, example embodiments will be described with reference to the attached drawings.

Figure 1:
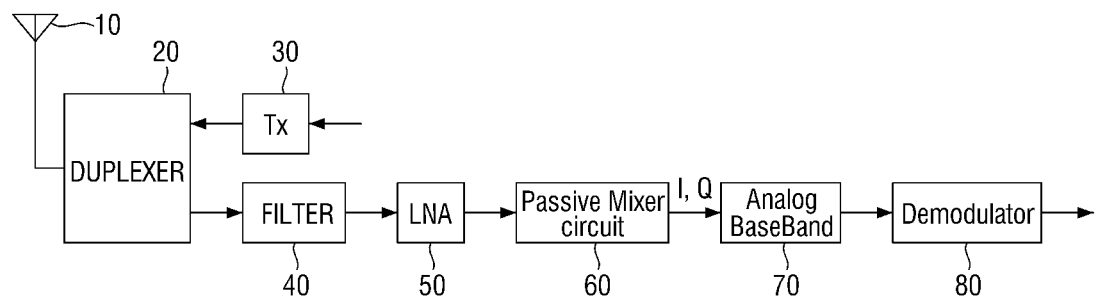
FIG. 1 is a schematic block diagram of a receiving system according to one or more example embodiments.

FIG. 1 is a schematic block diagram of a receiving system 1 according to one or more example embodiments.

FIG. 1 illustrates components of a direct conversion receiver used in down-conversion.

Conversion receivers of communication systems may be classified as a heterodyne type or a direct conversion type according to whether an intermediate frequency band is used. The heterodyne type uses the intermediate frequency band. The direct conversion type does not use the intermediate frequency band, and directly up-converts a low-frequency data signal in a baseband into a high-frequency data signal in an RF band and directly down-converts a high-frequency data signal in the RF band into a low-frequency data signal in the baseband. The receiver according to one or more example embodiments may be of the direct conversion type that does not use the intermediate frequency band.

Referring to FIG. 1, the receiving system 1 may include an antenna 10, a duplexer 20, a transmitting terminal 30, a filter 40, a low-noise amplifier (LNA) 50, a passive mixer circuit 60, an analog baseband 70, and a demodulator 80.

When a part of the receiving system 1 illustrated in FIG. 1 operates as a transmitter, a transmission signal may be transmitted through the antenna 10 via the transmitting terminal 30 and the duplexer 20. When the receiving system 1 operates as a receiver, a signal received through the antenna 10 may be input to the LNA 50 via the duplexer 20 and the filter 40.

The antenna 10 of the receiving system 1 of FIG. 1 may transmit signals to and receive signals from an external communication device. The antenna 10 may be included in, for example, a communication device using a radio frequency, such as radio, Wi-Fi, or Bluetooth, and transmit and receive signals. According to one or more example embodiments the antenna 10 of the receiving system 1 includes a plurality of antennas, and the antennas may be included in a multi-input, multi-output (MIMO) system.

The duplexer 20 may distinguish between signals. In the receiving system 1 according to one or more example embodiments, the duplexer 20 may be connected to the transmitting terminal 30 and a receiving terminal, and may input and output signals by distinguishing between a transmission signal and a reception signal and may input and output signals by distinguishing between mobile communication and near field communication (D2D).

The filter 40 may serve to remove other frequency domains. The filter 40 may be located between the duplexer 20 and the LNA 50 as illustrated in FIG. 1. However, example embodiments are not limited to this case, and the position of the filter 40 can be changed.

The LNA 50 may receive a signal from the filter 40 and increase a signal-to-noise ratio (SNR) by amplifying the signal to reduce the effect of noise on the signal before sending the signal to the passive mixer circuit 60.

The signal amplified by the LNA 50 may be input to the passive mixer circuit 60. The LNA 50 may include, for example, a parametric amplifier, a field effect (FET) amplifier, a tunnel diode amplifier, or a low-noise traveling wave amplifier (TWA). The LNA 50 may minimize noise by amplifying a weak RF signal.

The passive mixer circuit 60 may generate low-frequency data signals I and Q by mixing a received high-frequency data signal and a local oscillation signal LO. In a transmitter of a communication system, a low-frequency data signal in a baseband may be up-converted into a high-frequency data signal in an RF frequency band by a mixer and then transmitted. In a receiver of the communication system, a received high-frequency data signal in the RF band may be down-converted into a low-frequency data signal in the baseband by a mixer.

The passive mixer circuit 60 according to one or more example embodiments may perform down-conversion and generate the low-frequency data signals I and Q having a frequency corresponding to a difference between a frequency of the high-frequency data signal and a frequency of the local oscillation signal LO.

In the receiving system 1 according to one or more example embodiments, the analog baseband 70 may receive the low-frequency data signals I and Q from the passive mixer circuit 60 and transmit the low-frequency data signals I and Q to the demodulator 80 which demodulates an output signal.

The analog baseband 70 may be a circuit including a transimpedance amplifier (TIA). The TIA is a current/voltage converter and may include one or more operational amplifiers. The current/voltage converter may be used together with a sensor for a current response which is more linear than a voltage response. The use of the current/voltage converter may be changed for bandwidth control, direct current (DC) offset control, or the like depending on which sensor is used together with the current/voltage converter, and the configuration of the current/voltage converter may also be changed as the use of the current/voltage converter is changed.

In the receiving system 1 according to one or more example embodiments, the demodulator 80 may demodulate a received signal. The received signal may be, for example, a signal modulated using a predetermined method such as quadrature phase shift keying (QPSK), quadrature amplitude modulation (QAM), orthogonal frequency division multiplexing (OFDM), or vestigial side band modulation (VSB).

Figure 2:
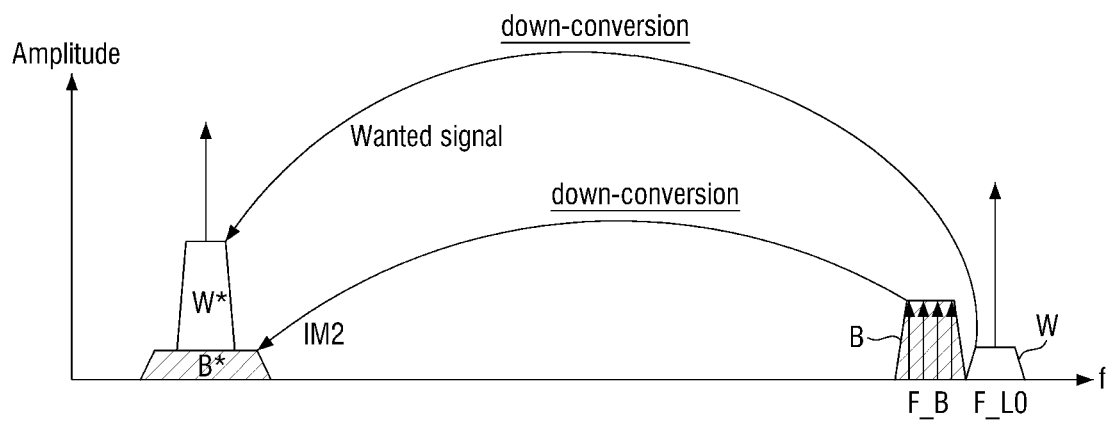
FIG. 2 is a diagram for explaining intermodulation in a receiving system according to one or more example embodiments.

FIG. 2 is a diagram for explaining intermodulation in a receiving system.

Referring to FIGS. 1 and 2, a reception signal W may be received from an antenna 10 and then transmitted to a filter 40, and a transmission signal block B may be transmitted from a transmitting terminal 30 and then received by the filter 40. The transmission signal block B may be generated when a transmission signal is received by the filter 40, including a case where a transmission signal leaks to the filter 40 because a duplexer 20 fails to completely distinguish the transmission signal, and a case where a transmission signal transmitted to the antenna 10 is received again. Thus, a signal received by the filter 40 may include both the reception signal W and the transmission signal block B.

The transmission signal block B may be in the form of a plurality of tones or may be continuously distributed in a frequency domain. In addition, although frequency domains of the reception signal W and the transmission signal block B are separated in FIG. 2, they may also be adjacent to each other or may overlap each other.

When the reception signal W and the transmission signal block B are down-converted by a mixer, the reception signal W may be down-converted into a down-converted reception signal W*, and the transmission signal block B may be down-converted into a down-converted transmission signal block B*. Together with the down-conversion, intermodulation may occur, and a second-order intermodulation (IM2) product component, which is a distortion component generated by IM2 distortion, may be generated. Although only the intermodulation between transmission signal blocks B is illustrated in FIG. 2, the intermodulation between reception signals W may also occur. The down-converted transmission signal block B* including the IM2 component as illustrated in FIG. 2 may become a noise component in the down-converted reception signal W, thus reducing the SNR.

Figure 3:
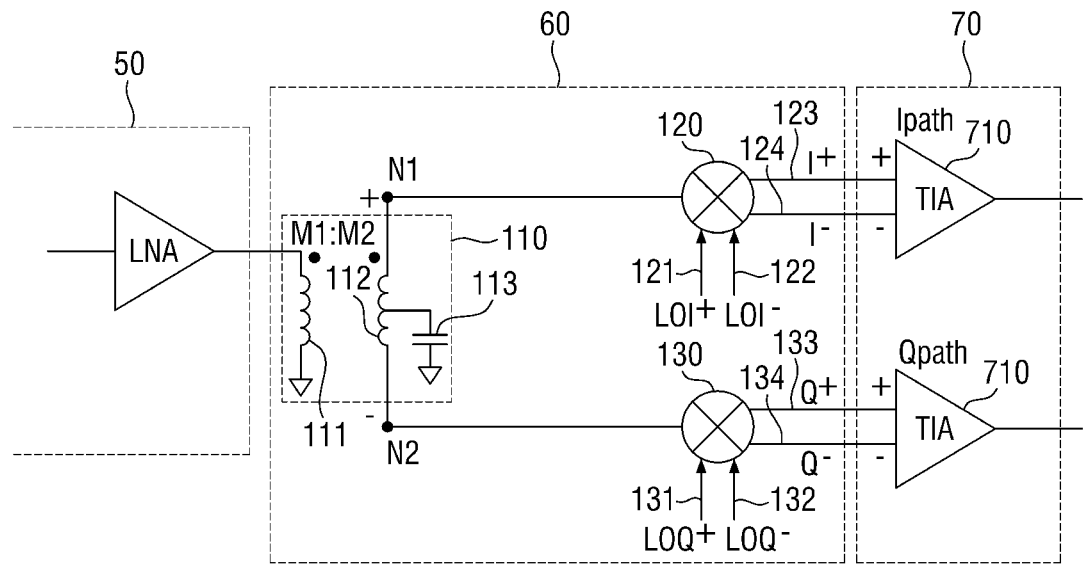
FIG. 3 is a circuit diagram of a receiver circuit according to one or more example embodiments.

FIG. 3 is a circuit diagram of a receiver circuit according to one or more example embodiments.

Referring to FIG. 3, a passive mixer circuit 60 is connected to the LNA 50 and the analog baseband 70.

The passive mixer circuit 60 may include a transformer 110, a first passive mixer 120, and a second passive mixer 130.

The transformer 110 may include a first coil 111, a second coil 112, and a first capacitor 113. The first coil 111 may be connected to the LNA 50 according to one or more example embodiments.

The second coil 112 may be inductively coupled to the first coil 111, and a ratio of the number of turns of the first coil 111 to the number of turns of the second coil 112 may be M1:M2. M1 and M2 may vary according to one or more example embodiments. In the transformer 110 according to one or more example embodiments, M1 and M2 may be the same or different from each other.

An end of the first capacitor 113 is connected to the second coil 112, and the other end of the first capacitor 113 is grounded.

The transformer 110 is connected between a first node N1 and a second node N2. The first node N1, which is an end of the transformer 110, is directly connected to the first passive mixer 120. The first passive mixer 120 includes differential local oscillation signal (LOI$^+$ and LOI$^-$) input terminals 121 and 122, and output terminals 123 and 124. The second node N2, which is the other end of the transformer 110, is directly connected to the second passive mixer 130. The second passive mixer 130 includes differential local oscillation signal (LOQ$^+$ and LOQ$^-$) input terminals 131 and 132, and output terminals 133 and 134.

The output terminals 123, 124, 133 and 134 of the first passive mixer 120 and the second passive mixer 130 of the passive mixer circuit 60 according to one or more example embodiments may be connected to TIAs 710 of the analog baseband 70.

It will be understood that when an element is referred to as being "connected to" another element, it can be directly connected to the other element or intervening elements may be present. In contrast, when a first element is referred to as being "directly connected to" a second element, there are no intervening elements present between the first element and the second element.

Figure 4:
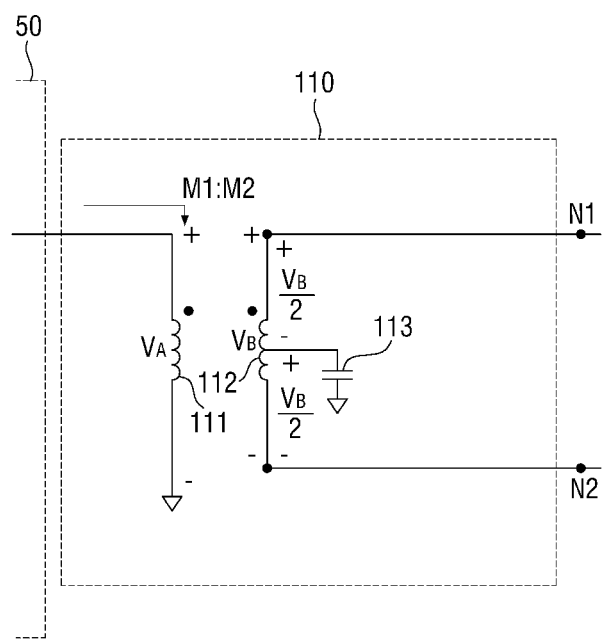
FIG. 4 is a circuit diagram illustrating a differential signal output process in the receiver circuit of FIG. 3.

FIG. 4 is a circuit diagram illustrating a differential signal output process in the receiver circuit of FIG. 3.

In FIG. 4, the transformer 110 receives a high-frequency data signal from the LNA 50 and outputs differential signals to the first node N1 and the second node N2 at both ends.

Voltage $V_A$ is input to the first coil 111 through the high-frequency data signal received from the LNA 50, and voltage $V_B$ is induced to the second coil 112 by the voltage $V_A$. A ratio of the voltage $V_A$ to the voltage $V_B$ may be the same as or different from the ratio of M1 to M2 which is the ratio of the number of turns of the first coil 111 to the number of turns of the second coil 112.

Referring to FIG. 4, the first capacitor 113 according to one or more example embodiments may be connected to a middle of the second coil 112. A positive voltage $$+\frac{V_B}{2}$$

may be induced between an end at which the second coil 112 and the first node N1 are connected and the middle. Positive voltage $$+\frac{V_B}{2}$$

may also be induced between the middle and the other end. The first capacitor 113 connected to the middle of the second coil 112 may be grounded at the initial stage of input. Therefore, negative voltage $$-\frac{V_B}{2}$$

may be induced between the second coil 112 and the other end.

Figure 5:
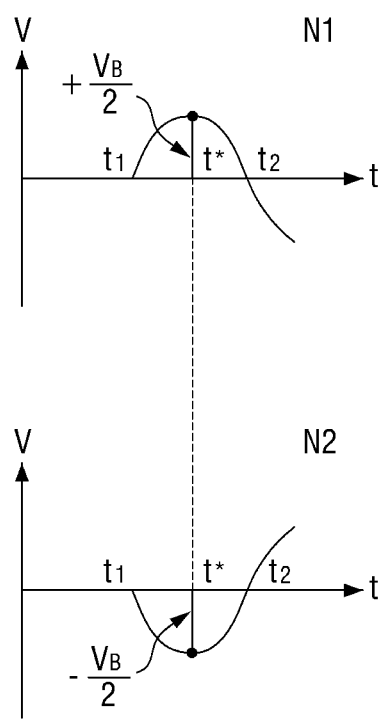
FIG. 5 illustrates differential signals output according to the differential signal output process of FIG. 4.

FIG. 5 illustrates differential signals output according to the differential signal output process of FIG. 4.

Referring to FIG. 5, voltages of the first node N1 and the second node N2 are graphically represented over time. At an initial time $t_1$, the voltages of the first node N1 and the second node N2 may be zero (0). At any time $t^*(t^*>t1)$, positive voltage $$+\frac{V_B}{2}$$

may be induced at the first node N1, and negative voltage $$-\frac{V_B}{2}$$

may be induced at the second node N2. There may also be a case where $V_B$ is zero over time. Therefore, the first node N1 and the second node N2 may output differential signals which have the same frequency and magnitude but are 180 degrees out of phase with each other.

Figure 6:
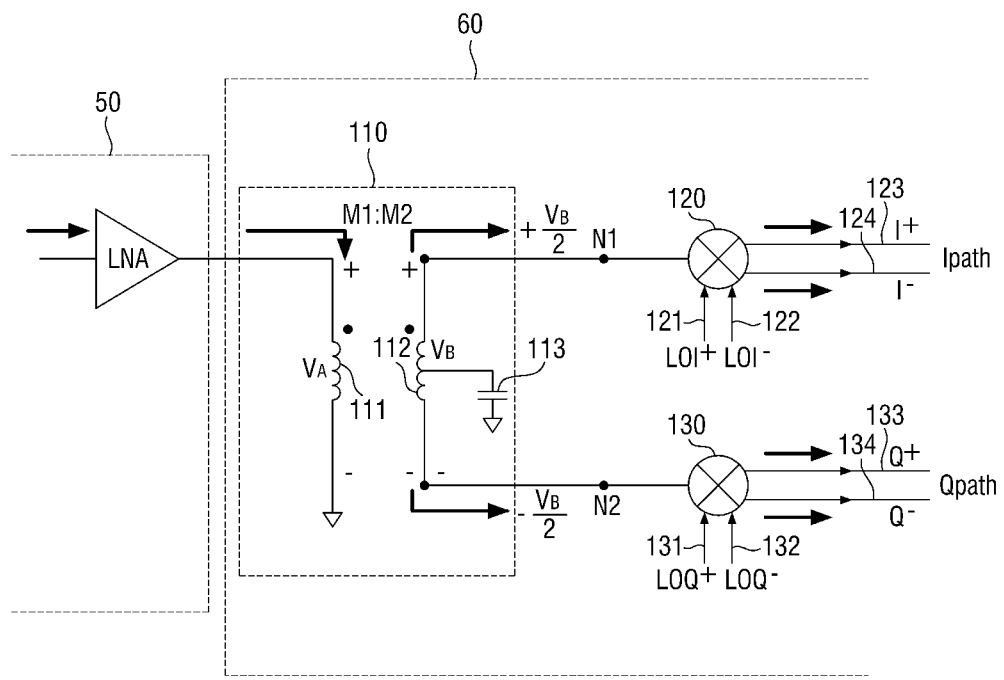
FIG. 6 schematically illustrates a path of a reception signal in the receiver circuit according to one or more example embodiments.

FIG. 6 schematically illustrates a path of a reception signal in the receiver circuit according to one or more example embodiments.

Referring to FIG. 6, a high-frequency data signal received from the LNA 50 may be applied to the first coil 111 in the form of $V_A$, and $V_B$ may be induced to the second coil 112 inductively coupled to the first coil 111 according to the M1 to M2 ratio. Due to the first capacitor 113, differential signals may be output to the first node N1 and the second node N2.

The differential signals are respectively input to the first passive mixer 120 and the second passive mixer 130, and mixed with differential local oscillation signals LOI$^+$, LOI$^-$, LOQ$^+$ and LOQ$^-$ and thus down-converted. LOI$^+$ and LOI$^-$ may be differential signals which have the same amplitude and frequency but are 180 degrees out of phase with each other. LOQ$^+$ and LOQ$^-$ may be differential signals which have the same amplitude and frequency but are 180 degrees out of phase with each other.

The first passive mixer 120 and the second passive mixer 130 may output down-converted low-frequency data signals I$^+$, I$^-$, Q$^+$ and Q$^-$ to the output terminals 123, 124, 133 and 134, respectively. I$^+$ and I$^-$ may be differential signals which have the same amplitude and frequency but are 180 degrees out of phase with each other. Q$^+$ and Q$^-$ may be differential signals which have the same amplitude and frequency but are 180 degrees out of phase with each other.

Figure 7:
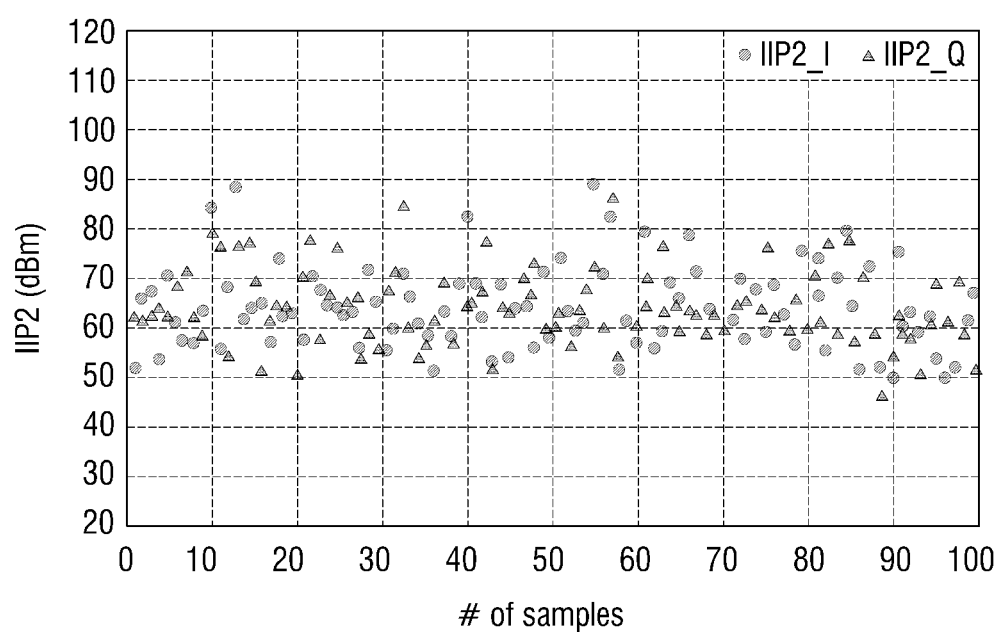
FIGS. 7 and 8 are diagrams for explaining performance of the receiver circuit according to one or more example embodiments.
Figure 8:
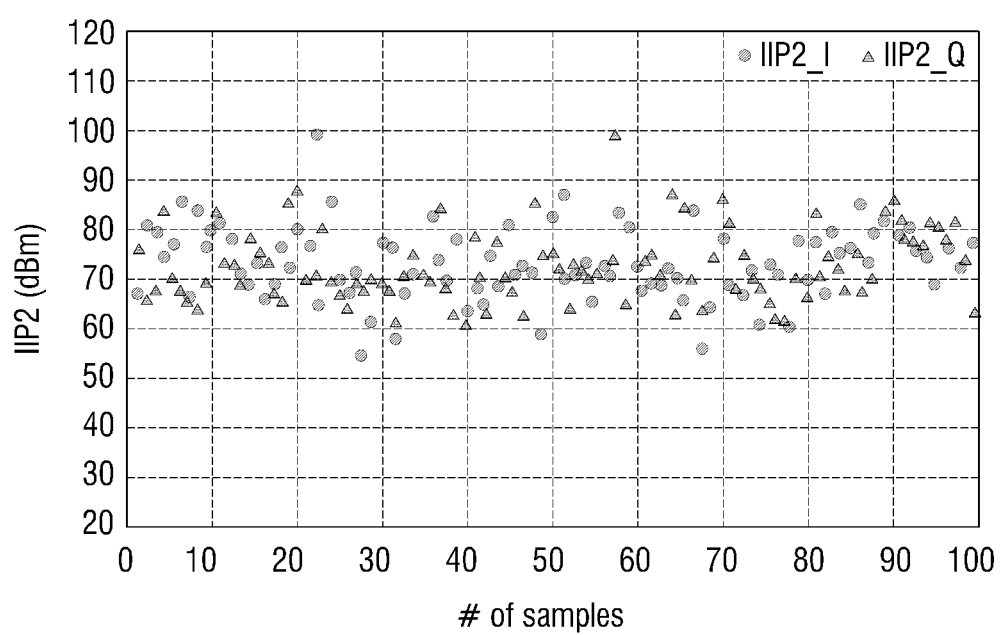

FIGS. 7 and 8 are diagrams for explaining performance of the receiver circuit according to one or more example embodiments.

FIG. 7 is a graph illustrating second-order intercept point (IIP2) performance of a related receiver circuit.

FIG. 8 is a graph illustrating IIP2 performance of the receiver circuit 60 according to one or more example embodiments.

Each point in the drawings represents the IIP2 performance of a receiver circuit output (I or Q) as one sample. IIP2, also called a second-order intercept point input, is a measure and input of linearity that quantifies the second-order distortion generated by nonlinear systems and devices.

More specifically, when the power of a reception signal continuously increases in a receiver, the power of an IM2 distortion signal also increases with a sharp slope, and a power point at which the reception signal and the IM2 distortion signal are expected to intersect may be defined as IIP2 when viewed from an input terminal of the receiver.

An IM2 component may be directly examined to determine the linearity of a nonlinear system. However, because IM2 varies in magnitude according to an input value of a reception signal, it is difficult to determine the linearity of the nonlinear system using only an IM2 value. Therefore, IM2 distortion of the nonlinear system may be determined based on an IIP2 performance value.

That is, in order to ensure high linearity in a nonlinear wireless communication system, IIP characteristics should be high, which may mean that IM2 distortion is minimized.

Ensuring high linearity of a nonlinear system by reducing IM2 distortion reduces the probability that an IM2 component will directly act as a noise in a reception signal and reduces third-order intermodulation (IM3), i.e., a distortion component due to IM3 distortion which is generated based on the IM2 component and can directly affect the reception signal. Therefore, the SNR can be increased without large power consumption.

Referring to FIGS. 7 and 8, in the related receiver circuit, 50 dB is a minimum value and 89 dB is a maximum value in Ipath, and 48 dB is the minimum value and 85 dB is the maximum value in Qpath. On average, Ipath and Qpath are distributed at 60 dB.

In the receiver circuit according to one or more example embodiments, 55 dB is the minimum value and 99 dB is the maximum value in Ipath, and 60 dB is the minimum value and 98 dB is the maximum value in Qpath. On average, Ipath and Qpath are distributed at 70 dB.

The minimum value of the receiver circuit according to one or more example embodiments is larger than that of the related receiver circuit by 5 dB for Ipath and 12 dB for Qpath, and the maximum value of the receiver circuit according to one or more example embodiments is larger than that of the related receiver circuit by 10 dB for Ipath and 13 dB for Qpath. On average, the receiver circuit according to one or more example embodiments is larger than the related receiver circuit by 10 dB.

Therefore, the receiver circuit according to one or more example embodiments may have higher linearity and thus a higher SNR than the related receiver circuit.

Figure 9:
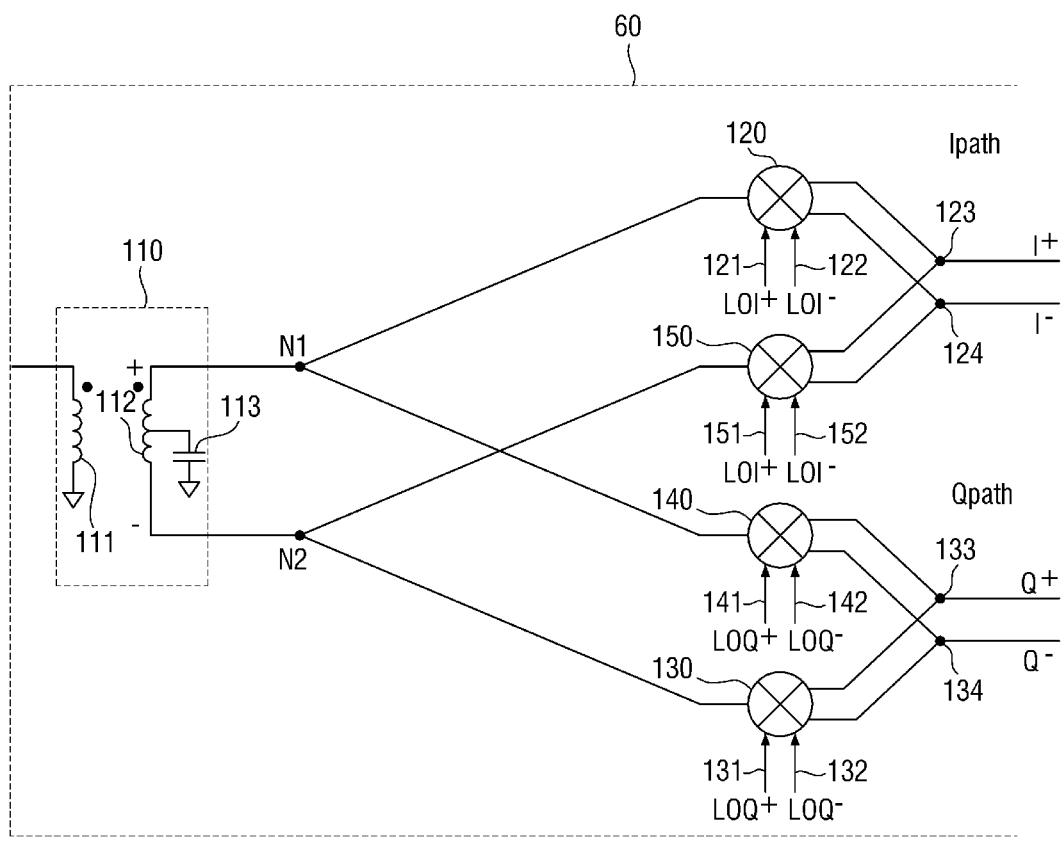
FIG. 9 is a circuit diagram of a receiver circuit according to one or more example embodiments.

FIG. 9 is a circuit diagram of a receiver circuit according to one or more example embodiments.

Referring to FIG. 9, a passive mixer circuit 60 according to one or more example embodiments may include a transformer 110, a first passive mixer 120, a second passive mixer 130, a third passive mixer 140, and a fourth passive mixer 150. The transformer 110 includes a first coil 111 and a second coil 112, and a first capacitor 113 having an end connected to the second coil 112 and the other end grounded. The first coil 111 and the second coil 112 may be inductively coupled to each other. The second coil 112 may be connected between a first node N1 and a second node N2. In the transformer 110, the first passive mixer 120 and the third passive mixer 140 may be directly connected to the first node N1, and the second passive mixer 130 and the fourth passive mixer 150 may be directly connected to the second node N2.

That is, a signal input to the first node N1 though an end of the second coil 112 may be split and then input to the first passive mixer 120 and the third passive mixer 140, and a signal input to the second node N2 though the other end of the second coil 112 may be split and then input to the second passive mixer 130 and the fourth passive mixer 150.

The first passive mixer 120 includes differential local oscillation signal (LOI$^+$ and LOI$^-$) input terminals 121 and 122, and the fourth active mixer 150 includes differential local oscillation signal (LOI$^+$ and LOI$^-$) input terminals 151 and 152. LOI$^+$ and LOI$^-$ are differential signals which have the same amplitude and frequency but are 180 degrees out of phase with each other.

Respective output ends of the first passive mixer 120 and the fourth passive mixer 150 may be connected to an output terminal 123, and the other respective output ends of the first passive mixer 120 and the fourth passive mixer 150 may be connected to an output terminal 124. The output terminals 123 and 124 output I$^+$ and I$^-$, respectively, and I+ and I$^-$ are differential signals which have the same amplitude and frequency but are 180 degrees out of phase with each other.

The second passive mixer 130 includes differential local oscillation signal (LOQ$^+$ and LOQ$^-$) input terminals 131 and 132, and the third active mixer 140 includes differential local oscillation signal (LOQ$^+$ and LOQ$^-$) input terminals 141 and 142. LOQ$^+$ and LOQ$^-$ are differential signals which have the same amplitude and frequency but are 180 degrees out of phase with each other.

Respective output ends of the second passive mixer 130 and the third passive mixer 140 may be connected to an output terminal 133, and the other respective output ends of the second passive mixer 130 and the third passive mixer 140 may be connected to an output terminal 134. The output terminals 133 and 134 output Q$^+$ and Q$^-$, respectively, and Q$^+$ and Q$^-$ are differential signals which have the same amplitude and frequency but are 180 degrees out of phase with each other.

The passive mixer circuit 60 according to FIG. 9 and the passive mixer circuit 60 according to FIG. 3 are different. When a single signal is received through one reception signal path (Ipath) and differential signals (I$^+$ and I$^-$) are output as illustrated in FIG. 3, a mixer according to FIG. 3 may be referred to as a single balanced mixer.

When differential signals are received through one reception signal path (Ipath) and differential signals (I$^+$ and I$^-$) are output as illustrated in FIG. 9, a mixer according to FIG. 9 may be referred to as a double balanced mixer.

Although different in mixer configuration, example embodiments consistent with FIG. 9 include the same capacitor arrangement as example embodiments consistent with FIG. 3 and thus have higher linearity and a higher SNR than a related receiver circuit.

Figure 10A:
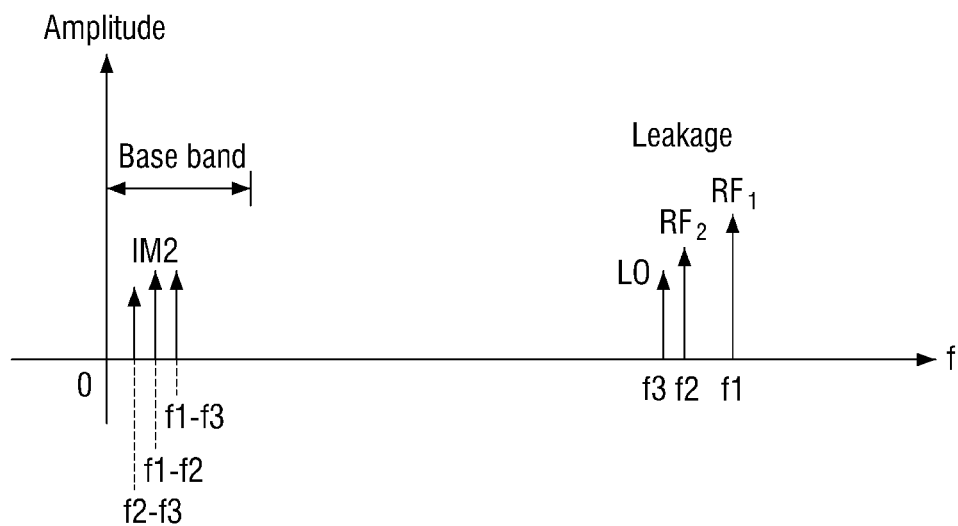
FIGS. 10A and 10B are graphs in a frequency domain illustrating characteristics of the balanced mixer configurations of FIGS. 3 and 9.
Figure 10B:
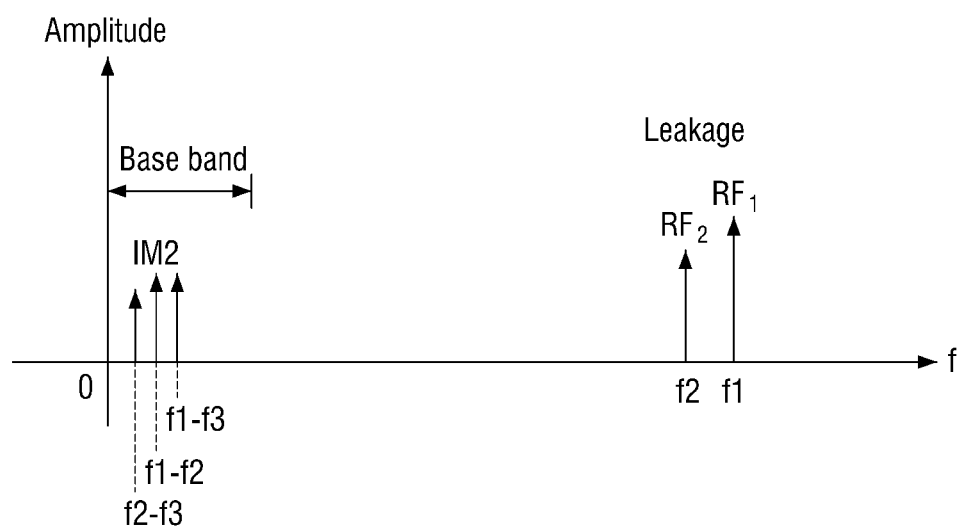

FIGS. 10A and 10B are graphs in a frequency domain illustrating characteristics of the balanced mixer configurations of FIGS. 3 and 9.

Referring to FIGS. 3 and 10A, when a signal is down-converted by a single balanced mixer as in one or more example embodiments consistent with FIG. 3, the down-converted signal (I$^+$ in FIG. 3) is provided in a frequency domain. After the down-conversion, leakages of RF1 and RF2 reception signals may remain at f1 and f2, respectively. Likewise, a leakage of a local oscillation signal LO at f3 may remain.

Because the receiving system has selected the direct conversion type instead of the heterodyne type, a signal may not be converted into an intermediate frequency domain.

In a baseband frequency, there may be an f1-f2 frequency signal intermodulated between a reception signal and a signal down-converted into a frequency of f1-f3 or f2-f3.

Referring to FIGS. 9 and 10B, when a signal is down-converted by a double balanced mixer as in one or more example embodiments consistent with FIG. 9, the down-converted signal (I$^+$ in FIG. 9) is provided in a frequency domain. After the down-conversion, leakages of RF1 and RF2 reception signals may remain at frequencies of f1 and f2, respectively. However, a leakage of a local oscillation signal LO at a frequency of f3 may be removed, unlike in the single balanced mixer.

In the baseband frequency, as in FIG. 3, there may be an f1-f2 frequency signal intermodulated between a reception signal and a signal down-converted to a frequency of f1-f3 or f2-f3.

Figure 11:
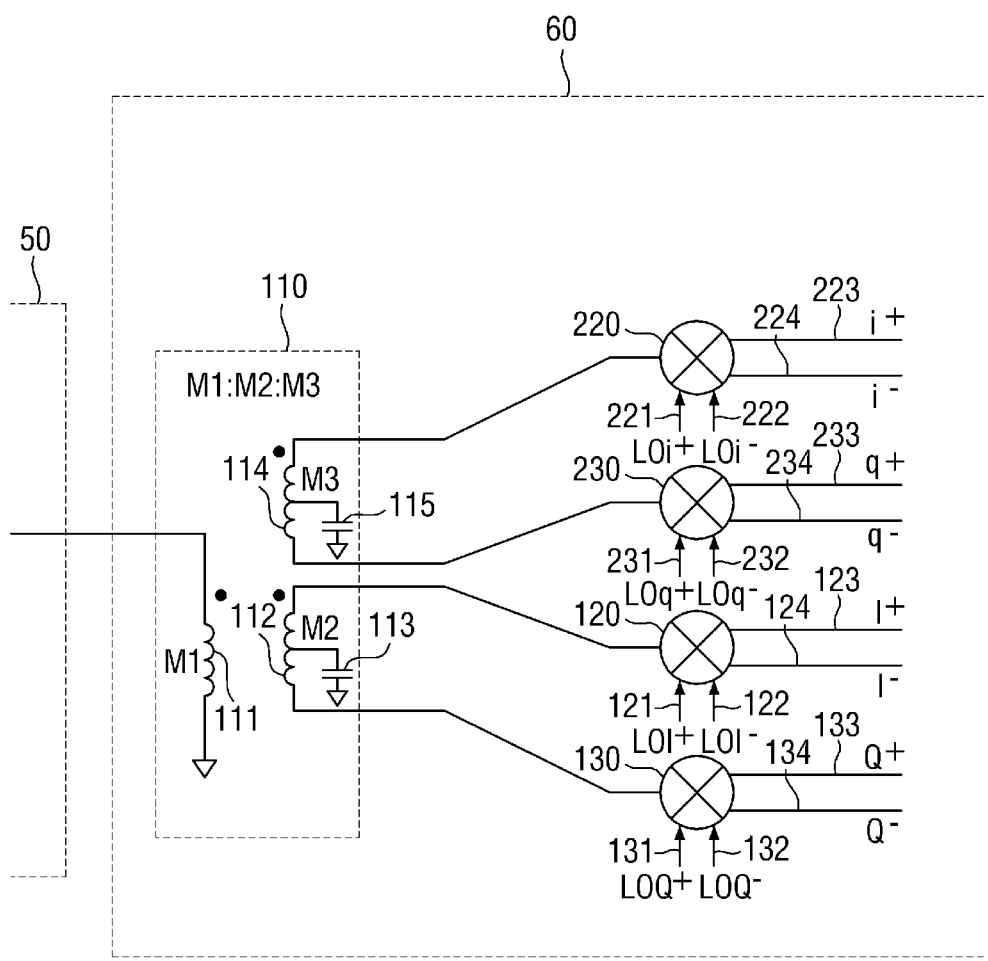
FIG. 11 is a circuit diagram of a receiver circuit according to one or more example embodiments.

FIG. 11 is a circuit diagram of a receiver circuit according to one or more example embodiments.

Referring to FIG. 11, a passive mixer circuit 60 may be connected to the LNA 50.

In the passive mixer circuit 60, a transformer 110 may include a first coil 111, a second coil 112, a third coil 114, a first capacitor 113, and a second capacitor 115. The first coil 111 may be connected to the LNA 50, and the second coil 112 and the third coil 114 may be secondary coils and inductively coupled to the first coil 111. The numbers of turns of the first coil 111, the second coil 112, and the third coil 114 are M1, M2, and M3, respectively, may vary according to one or more example embodiments. According to some example embodiments, the number of turns M1, M2 and M3 may be the same or different from each other.

An end of the first capacitor 113 may be connected to the second coil 112, and the other end of the first capacitor 113 may be grounded. An end of the second capacitor 115 may be connected to the third coil 114, and the other end of the second capacitor 115 may be grounded.

A first passive mixer 120 may be directly connected to an end of the second coil 112, and a second passive mixer 130 may be directly connected to the other end of the second coil 112. The first passive mixer 120 may include differential local oscillation signal (LOI$^+$ and LOI$^-$) input terminals 121 and 122, and output terminals 123 and 124. The second passive mixer 130 may include differential local oscillation signal (LOQ$^+$ and LOQ$^-$) input terminals 131 and 132, and output terminals 133 and 134.

A fifth passive mixer 220 may be directly connected to an end of the third coil 114, and a sixth passive mixer 230 may be directly connected to the other end of the third coil 114. The fifth passive mixer 220 may include differential local oscillation signal (LOi$^+$ and LOi$^-$) input terminals 221 and 222, and output terminals 223 and 224. The sixth passive mixer 230 may include differential local oscillation signal (LOq$^+$ and LOq$^-$) input terminals 231 and 232, and output terminals 233 and 234.

Because the example embodiment consistent with of FIG. 11 also includes the capacitor arrangement of the above example embodiments, a higher linearity and a higher SNR may be provided.

Figure 12:
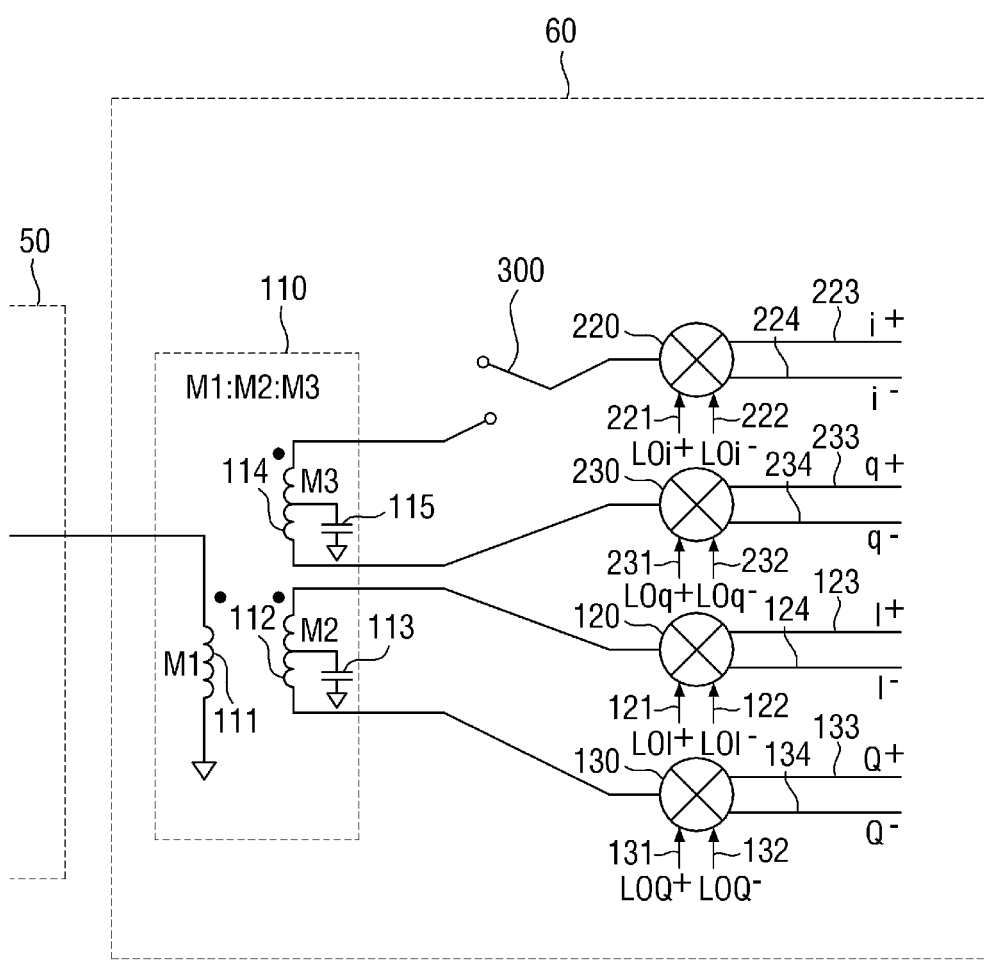
FIG. 12 is a circuit diagram of a receiver circuit according to one or more example embodiments.

FIG. 12 is a circuit diagram of a receiver circuit according to one or more example embodiments.

Referring to FIG. 12, the passive mixer circuit 60 according to one or more example embodiments consistent with FIG. 11 may further include a switch 300 between the third coil 114 and the fifth passive mixer 220 or between the third coil 114 and the sixth passive mixer 230. As the switch 300 is closed and opened, the fifth passive mixer 220 and the sixth passive mixer 230 connected to the third coil 114 may be turned on or off. The one or more example embodiments consistent with FIG. 12 may also have higher linearity and thus a higher SNR than a related receiver circuit.

In a receiver circuit according to one or more example embodiments, capacitors are removed from a plurality of reception paths but are placed between secondary coils and a ground terminal. Accordingly, the number of capacitors in the receiver is reduced to reduce total circuit area, and an IM2 component included in a low-frequency data signal is reduced to increase IIP2 performance.

While example embodiments have been shown and described above, it will be apparent to those skilled in the art that many variations and modifications may be made to the example embodiments without substantially departing from the principles of the present disclosure as defined by the appended claims.

What is claimed is:
1. A receiver circuit comprising:
a filter configured to filter a radio frequency (RF) signal received through an antenna configured to receive the RF signal; and
a passive mixer circuit configured to adjust a center frequency of the filtered RF signal to a predetermined frequency,
wherein the passive mixer circuit comprises:
a transformer which comprises a first coil and a second coil that is separate from the first coil;
a first passive mixer which is directly connected to a first end of the second coil;
a second passive mixer which is directly connected to a second end of the second coil and is separate from the first passive mixer; and
a first capacitor having a first end connected to a middle of the second coil and a second end grounded,
wherein the first end of the first capacitor is configured not to receive a DC bias voltage and there is no intervening element between the first passive mixer and the first end of the second coil and between the second passive mixer and the second end of the second coil.
2. The receiver circuit of claim 1,
wherein the second coil outputs differential signals to the first passive mixer and the second passive mixer respectively.
3. The receiver circuit of claim 2, wherein the passive mixer circuit further comprises:
a third passive mixer which is connected to a first node located between the first end of the second coil and the first passive mixer; and
a fourth passive mixer which is connected to a second node located between the second end of the second coil and the second passive mixer.
4. The receiver circuit of claim 2, wherein the transformer further comprises a third coil, and
wherein the passive mixer circuit further comprises a third passive mixer which is directly connected to a first end of the third coil and a fourth passive mixer which is directly connected to a second end of the third coil and is separate from the third passive mixer.
5. The receiver circuit of claim 4, wherein the passive mixer circuit further comprises a second capacitor having a first end connected to the third coil and a second end grounded.

6. The receiver circuit of claim 5, wherein a number of turns of the second coil is different from a number of turns of the third coil.

7. The receiver circuit of claim 1, further comprising:
a third passive mixer which is connected to a first node located between the first end of the second coil and the first passive mixer; and
a fourth passive mixer which is connected to a second node located between the second end of the second coil and the second passive mixer.

8. The receiver circuit of claim 1, wherein the transformer further comprises a third coil, and
wherein the passive mixer circuit further comprises a third passive mixer which is directly connected to a first end of the third coil and a fourth passive mixer which is directly connected to a second end of the third coil and is separate from the third passive mixer.

9. The receiver circuit of claim 8, wherein the passive mixer circuit further comprises a second capacitor having a first end connected to the third coil and a second end grounded.

10. The receiver circuit of claim 9, wherein a number of turns of the second coil is different from a number of turns of the third coil.

11. A receiver circuit comprising:
a filter configured to filter a radio frequency (RF) signal received through an antenna to receive the RF signal; and
a passive mixer circuit configured to adjust a center frequency of the filtered RF signal to a predetermined frequency,
wherein the passive mixer circuit comprises:
a transformer which comprises a first coil and a second coil that is separate the first coil;
a first passive mixer configured to directly receive a first signal from the second coil;
a second passive mixer configured to directly receive a second signal from the second coil; and
a first capacitor which has a first end connected to a middle of the second coil and a second end grounded,
wherein the first signal and the second signal are differential signal each other, and
wherein the first end of the first capacitor is configured not to receive a DC bias voltage and there is no intervening element between the first passive mixer and the first end of the second coil and between the second passive mixer and the second end of the second coil.

12. The receiver circuit of claim 11, wherein the passive mixer circuit further comprises:
a third passive mixer which is connected to a first node located between a first end of the second coil and the first passive mixer; and
a fourth passive mixer which is connected to a second node located between a second end of the second coil and the second passive mixer.

13. The receiver circuit of claim 11, wherein the transformer further comprises a third coil, and
wherein the passive mixer circuit further comprises a third passive mixer which is directly connected to a first end of the third coil and a fourth passive mixer which is directly connected to a second end of the third coil and is separate from the third passive mixer.

14. The receiver circuit of claim 13, further comprising a switch interposed between the third coil and the third passive mixer.

15. A receiving system comprising:
an antenna configured to receive a radio frequency (RF) signal;
a filter configured to filter the RF signal received through the antenna;
a passive mixer circuit configured to adjust a center frequency of the filtered RF signal to a predetermined frequency;
an analog baseband configured to process an output signal of the passive mixer circuit; and
a demodulator configured to demodulate an analog baseband output signal of the analog baseband,
wherein the passive mixer circuit comprises:
a transformer which comprises a first coil and a second coil, the filter being connected to the first coil;
a first passive mixer which is directly connected to a first end of the second coil and is configured to output the output signal;
a second passive mixer which is directly connected to a second end of the second coil and is configured to output the output signal; and
a first capacitor which has a first end connected to a middle of the second coil between the first end of the second coil and the second end of the second coil, and a second end grounded,
wherein the first end of the first capacitor is configured not to receive a DC bias voltage and there is no intervening element between the first passive mixer and the first end of the second coil and between the second passive mixer and the second end of the second coil.

16. The receiving system of claim 15, wherein the passive mixer circuit further comprises:
a third passive mixer which is connected to a first node located between the first end of the second coil and the first passive mixer; and
a fourth passive mixer which is connected to a second node located between the second end of the second coil and the second passive mixer.

17. The receiving system of claim 15, further comprising a low-noise amplifier (LNA) configured to amplify an input signal.

18. The receiving system of claim 17, wherein the LNA comprises any one or any combination of a parametric amplifier, a field effect (FET) amplifier, a tunnel diode amplifier, and a low-noise traveling wave amplifier (TWA).

19. The receiving system of claim 15, wherein the analog baseband comprises a transimpedance amplifier (TIA).

20. The receiving system of claim 15, wherein the transformer further comprises a third coil, and
wherein the passive mixer circuit further comprises a third passive mixer which is directly connected to a first end of the third coil and a fourth passive mixer which is directly connected to a second end of the third coil and is separate from the third passive mixer.

* * * * *